US006483716B1

(12) United States Patent
Shin

(10) Patent No.: US 6,483,716 B1
(45) Date of Patent: Nov. 19, 2002

(54) VIDEO CASSETTE RECORDER HAVING PREAMPLIFIER INCORPORATED WITH MAIN BOARD

(75) Inventor: Ik-kyung Shin, Suwon (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 665 days.

(21) Appl. No.: 08/808,183

(22) Filed: Feb. 28, 1997

(30) Foreign Application Priority Data

Apr. 9, 1996 (KR) .............................. 96-10610

(51) Int. Cl.[7] ................................. H05K 9/00
(52) U.S. Cl. ..................... 361/800; 361/816; 174/35 R
(58) Field of Search ................ 361/728, 752, 361/754, 800, 816, 818; 74/35 R; 439/607–610; 330/68

(56) References Cited

U.S. PATENT DOCUMENTS 4,578,718 A * 3/1986 Parker et al. ............... 360/27
4,972,190 A * 11/1990 Primeau et al. ............ 341/122

* cited by examiner

Primary Examiner—Jayprakash N. Gandhi
(74) Attorney, Agent, or Firm—Sughrue Mion, PLLC

(57) ABSTRACT

A VCR having a preamplifier circuit which is physically incorporated with its main circuit board. The VCR includes a deck (31) for picking up a video signal, a connector cable (33) for supplying the video signal picked up by the deck to the preamplifier, a main board (35) on which the preamplifier is incorporated, and a shield case (34) for shielding the preamplifier and electrically contacting a wide portion of the deck (31). It is possible to improve manufacturing productivity with such an arrangement where the preamplifier is incorporated onto the main circuit board, because the process steps for assembling the separate preamplifier board (25) are omitted. It is also possible to reduce noise interference since the shielding case (34) for shielding the preamplifier is installed level with the deck portion (31), thus enlarging the electrical contact area between the shielding case (34) and the deck (31) to provide enhanced grounding.

4 Claims, 1 Drawing Sheet

VIDEO CASSETTE RECORDER HAVING PREAMPLIFIER INCORPORATED WITH MAIN BOARD

BACKGROUND OF THE INVENTION

The present invention relates to a video cassette recorder (VCR) board. More particularly, it relates to a VCR having a preamplifier incorporated with its main circuit board. This application is based on Korean Patent Application No. 96-10610 which is incorporated by reference herein for all purposes.

FIG. 1 is a block diagram showing a general VCR. Referring to FIG. 1, when a deck portion 1 picks up a video signal recorded on a video tape (not shown) and outputs the picked up video signal, a preamplifier portion 2 amplifies the weak picked up video signal and outputs it to a video signal processing portion 3. The video signal processing portion 3 processes the video signal reproduced from the tape, and then divides it into an image signal and an audio signal, and outputs the two signals.

Additionally, when recording a TV broadcast signal, a tuner 4 selects a TV broadcast signal and the video processing portion 3 performs a signal processing of the selected TV broadcast signal. Then the preamplifier portion 2 amplifies the signal processed by processing portion 3, and the deck portion 1 records the TV broadcast signal on a video tape (not shown).

A conventional VCR has a preamplifier board which is separate from its main circuit board, as will be further described below. FIG. 2 is a perspective view showing a portion of a conventional VCR whose preamplifier board 25 is separate from its main board 26.

In FIG. 2, the video signal which is picked up from the video tape through a drum 22 in a deck 21 is output to a preamplifier board 25 through a connector cable 23. The preamplifier circuitry (not shown) is located on the preamplifier board 25 and is sealed-up in a shielding case 24 in order to prevent the weak picked up video signal from being interfered with by external noise. The video signal which is picked up by the drum 22 is output from the drum 22 to the preamplifier board 25 through the connector cable 23 and is amplified by about 60 dB. The video signal amplified in the preamplifier board 25 is output to the video signal processing portion 3 of a main circuit board 26.

The conventional preamplifier board 25 is vertically connected to the main board 26 as shown in FIG. 2. That is to say, the preamplifier board 25 is conventionally mounted on the main board 26 at a right angle, which would make the preamplifier board 25 lie in a vertical plane, assuming that the main board 26 lies in a horizontal plane. Because of this vertical mounting of the preamplifier board 25 with respect to the main board 26, the productivity of connecting the connector cable 23 between the drum 22 and the preamplifier board 25 is lowered since the inner space of a VCR set is narrowed by the preamplifier board 25. Also, since the preamplifier board 25 is vertically connected to the main board 26, it is hard to maintain a good grounding between the deck 21 and the shielding case 24, because it is difficult to obtain a wide enough contact area between the deck 21 and the shielding case 24. The result is that it is hard to obtain grounding for the shielding case 24 sufficient to remove the interference of external noise.

SUMMARY OF THE INVENTION

It is an object of the present invention to provide a VCR to improve the productivity of a VCR by incorporating a preamplifier board into the main circuit board and to remove the interference of noise by securing a wider grounding surface for a preamplifier shielding case.

To achieve the above object, there is provided a video cassette recorder (VCR) having a preamplifier incorporated with its main board. The VCR comprises a deck for picking up a video signal, a connector cable for supplying the video signal picked up by the deck to the preamplifier, a main board on which the preamplifier is incorporated, and a shielding case, contacting a portion of the deck, for shielding the preamplifier.

The shield case contacts a wider surface of the deck since it is level with the deck.

BRIEF DESCRIPTION OF THE DRAWINGS

The above object of the present invention, and its various advantages, will become more apparent by describing in detail a preferred embodiment thereof with reference to the attached drawings in which.

DETAILED DESCRIPTION OF THE INVENTION

A preferred embodiment of the present invention is described in detail below with reference to the attached drawings.

Figure 1:
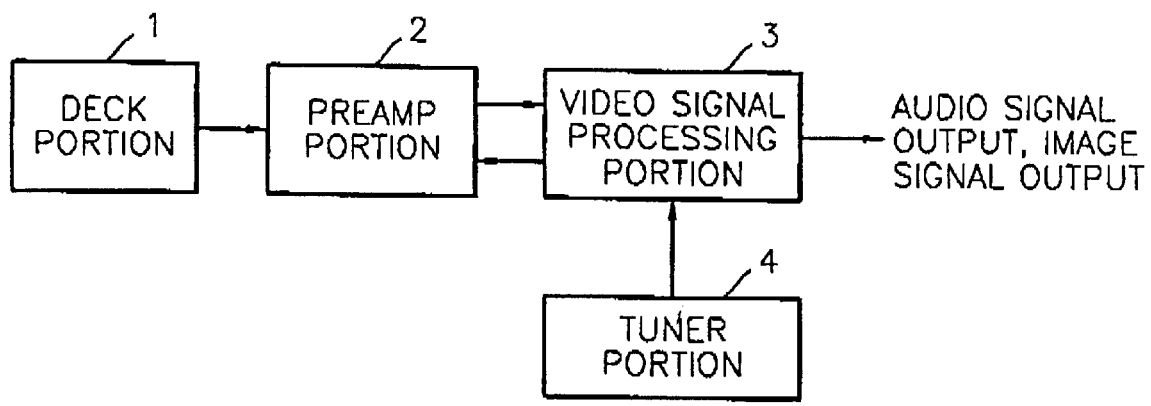
FIG. 1 is a block diagram showing a general VCR.
Figure 2:
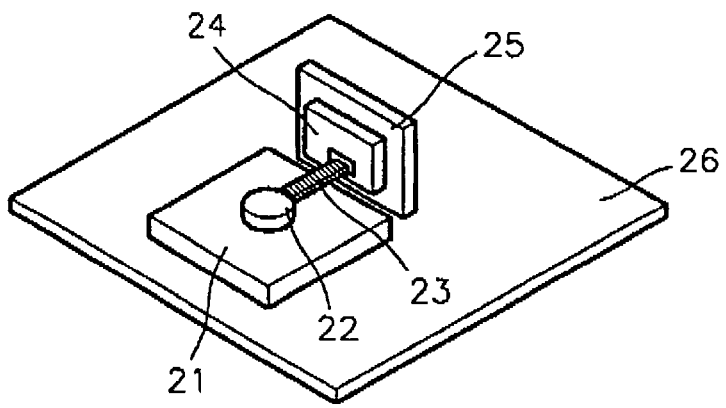
FIG. 2 is a perspective view showing a portion of a conventional VCR whose preamplifier board is distinct from its main circuit board.
Figure 3:
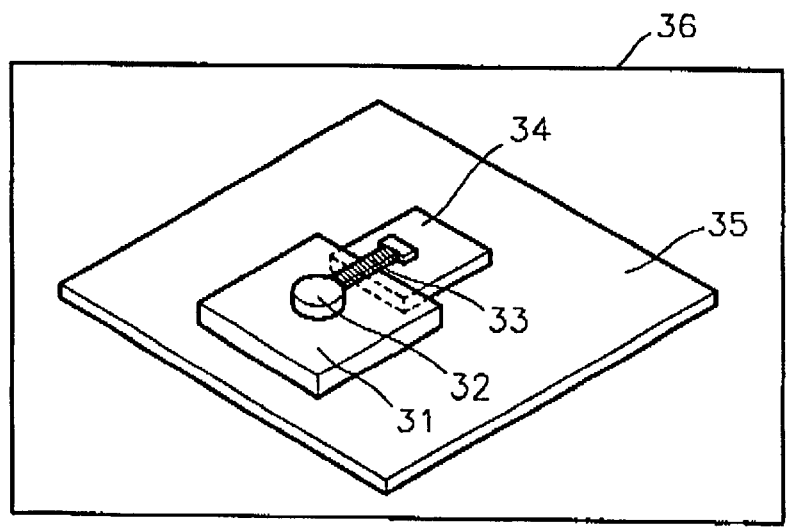
FIG. 3 is a perspective view showing a portion of a VCR according to the preferred embodiment, where the preamplifier is incorporated with the main circuit board.

FIG. 3 shows a portion of a VCR 36 whose preamplifier is incorporated with its main board according to the present invention. The apparatus shown in FIG. 3 includes a deck 31, a drum 32, a connector cable 33, a shielding case 34, and a main circuit board 35. A reproduced signal is picked up from a video tape by the drum 32 of the deck 31, and is output, via the connector cable 33, to the preamplifier (not shown) incorporated in the main board 35. The shielding case 34 is in contact with the deck 31 to securely shield the end of the connector cable 33 which is connected to the preamplifier. The shielding case 34 also shields that portion of the main circuit board 35 where the preamplifier is located, in order to isolate the weak reproduced video signal from external noise.

Since the preamplifier circuit is incorporated into the main circuit board 35, it is almost level with the deck 31, and it is therefore possible to obtain a secure grounding effect by directly electrically contacting the shield case 34 to a large area of the deck 31, which is wider than would be possible using the conventional preamplifier board arrangement.

In the VCR whose preamplifier is incorporated with its main board according to the present invention, it is possible to improve productivity since the preamplifier is incorporated in the main board, because the assembly process step of assembling the preamplifier board to the main board is omitted. This arrangement also reduces noise interference since the shielding case for shielding the preamplifier is installed level with the deck portion, thus enlarging the contact area between the shielding case and the deck.

Although the present invention has been described above in terms of a preferred embodiment, it will be appreciated that numerous modifications may be made to the described embodiment without departing from the spirit and scope of the invention.

What is claimed is:

1. A video cassette recorder comprising:

a main circuit board;

a preamplifier, wherein said preamplifier is an integral part of said main circuit board;

a deck for picking up a video signal; and a connector cable for supplying the video signal picked up by said deck to said preamplifier.

2. A video cassette recorder as claimed in claim 1, further comprising:

a shielding case for shielding said preamplifier and electrically contacting a portion of said deck.

3. The video cassette recorder according to claim 2, wherein said shielding case is level with said deck and electrically contacts a wide surface area of the deck.

4. A video cassette recorder comprising:

a main circuit board;

a preamplifier, wherein said preamplifier is an integral part of said main circuit board;

a deck which picks up a video signal from a video cassette;

a connector cable, coupled between said deck and said preamplifier, to supply the video signal picked up by said deck to said preamplifier; and a shielding case, mounted on said main circuit board over said preamplifier and electrically contacting a portion of said deck; to shield said preamplifier;

wherein said shielding case is level with said deck and electrically contacts a wide surface area of the deck.

* * * * *